US010094016B2

(12) United States Patent
Kornmeyer et al.

(10) Patent No.: US 10,094,016 B2
(45) Date of Patent: Oct. 9, 2018

(54) MODULAR TUBULAR SUSCEPTOR

(71) Applicant: KGT Graphit Technologie GmbH, Windhagen (DE)

(72) Inventors: Torsten Kornmeyer, Königswinter (DE); Meinhard Wisskirchen, Rheinbach (DE); Steffen Still, Köln (DE)

(73) Assignee: KGT Graphit Technologie GmbH, Windhagen (DE)

( * ) Notice: Subject to any disclaimer, the term of this patent is extended or adjusted under 35 U.S.C. 154(b) by 0 days.

(21) Appl. No.: 14/404,948

(22) PCT Filed: Jun. 3, 2013

(86) PCT No.: PCT/EP2013/061384
§ 371 (c)(1),
(2) Date: Dec. 1, 2014

(87) PCT Pub. No.: WO2013/178824
PCT Pub. Date: Dec. 5, 2013

(65) Prior Publication Data
US 2015/0144057 A1 May 28, 2015

(30) Foreign Application Priority Data
Jun. 1, 2012 (DE) .................. 10 2012 209 278

(51) Int. Cl.
*H01L 21/673* (2006.01)
*C23C 14/50* (2006.01)
(Continued)

(52) U.S. Cl.
CPC ............ *C23C 14/50* (2013.01); *C23C 14/564* (2013.01); *C23C 16/4581* (2013.01);
(Continued)

(58) Field of Classification Search
CPC ............ H01L 21/67386; H01L 21/6719; H01L 21/67313; H01L 21/67356; C23C 14/50;
(Continued)

(56) References Cited

U.S. PATENT DOCUMENTS 3,804,060 A * 4/1974 Donahue ............... C30B 19/068
118/426
4,117,252 A * 9/1978 McMaster ................ H05B 3/64
219/552

(Continued)

FOREIGN PATENT DOCUMENTS

CN 101573765 A 11/2009
EP 1590510 B1 3/2007

(Continued)

OTHER PUBLICATIONS

International Search Report for application No. PCT/EP2013/061384, dated Aug. 22, 2013, 3 pages—translated.

(Continued)

*Primary Examiner* — Karl Kurple
(74) *Attorney, Agent, or Firm* — Reising Ethington P.C.

(57) ABSTRACT

The invention relates to a susceptor which is for the processing chamber of protective gas and vacuum high-temperature processing installations and consists of graphite or CFC, has a tunnel-like design, and can be closed by a cover at both its ends. The invention should allow the provision of a flexibly and modularly extendable susceptor that has a material-saving design and, in particular, uniform thermal expansion. This is achieved by virtue of the fact that said susceptor (1) consists of a plurality of modules (2) aligned one next to the other along a continuous tunnel, that each module (2) consists of a tubular section (3) and a base panel (4) fixed thereto, and that the end faces (5) between each pair of modules (2) are interconnected in a form-fitting manner.

4 Claims, 4 Drawing Sheets

(51) Int. Cl.
*H01L 21/67* (2006.01)
*C23C 16/458* (2006.01)
*C23C 14/56* (2006.01)
*B05C 13/02* (2006.01)

(52) U.S. Cl.
CPC .... *H01L 21/6719* (2013.01); *H01L 21/67109* (2013.01); *H01L 21/67196* (2013.01); *H01L 21/67386* (2013.01); *B05C 13/02* (2013.01)

(58) Field of Classification Search
CPC ......... C23C 14/56; Y10T 428/13; F27D 1/00; F27D 1/04; F27B 9/029; F16B 5/01; F16B 13/00; F16B 15/00; F16B 17/00
USPC .................... 118/50, 719; 373/111.117, 118; 428/34.1, 408; 52/578, 582.1, 285.4, 52/223.3, 506.2, FOR. 129
See application file for complete search history.

(56) References Cited

U.S. PATENT DOCUMENTS

| | | | | |
|---|---|---|---|---|
| 4,152,533 | A * | 5/1979 | Gazda | H05B 7/14 373/91 |
| 4,290,709 | A * | 9/1981 | Seldin | H05B 7/14 373/92 |
| 4,523,531 | A * | 6/1985 | Bishara | F27D 1/14 110/336 |
| 4,571,910 | A * | 2/1986 | Cosentino | E04F 13/0892 52/391 |
| 4,703,556 | A * | 11/1987 | Wilsey | H05B 3/62 219/553 |
| 4,755,658 | A * | 7/1988 | Wilsey | H05B 3/62 219/541 |
| 4,870,256 | A * | 9/1989 | Heise | H05B 3/66 219/542 |
| 5,014,478 | A * | 5/1991 | Spring | E04B 1/6158 52/271 |
| 5,414,927 | A * | 5/1995 | Fiel | C04B 35/52 29/611 |
| 5,634,645 | A | 6/1997 | Seki et al. | |
| 5,673,528 | A * | 10/1997 | Danisch | G21C 13/00 376/293 |
| 5,912,080 | A | 6/1999 | Fiel et al. | |
| 7,021,019 | B2 * | 4/2006 | Knauseder | E04F 13/10 24/297 |
| 2002/0017013 | A1 | 2/2002 | Petruccelli | |
| 2006/0156642 | A1 * | 7/2006 | Terzi | E04B 1/12 52/79.1 |
| 2006/0213436 | A1 * | 9/2006 | Ohmi | H01J 37/32192 118/715 |
| 2007/0128569 | A1 | 6/2007 | Tenzek et al. | |
| 2008/0232424 | A1 * | 9/2008 | Miller | C23C 16/045 373/72 |
| 2010/0111512 | A1 * | 5/2010 | Kumagai | G01J 5/62 392/416 |
| 2011/0131916 | A1 * | 6/2011 | Chen | E04F 15/02 52/588.1 |
| 2011/0259462 | A1 * | 10/2011 | Gaigler | E04H 7/02 138/155 |
| 2012/0149212 | A1 * | 6/2012 | Strauch | C23C 16/4412 438/763 |
| 2012/0152960 | A1 * | 6/2012 | Toews | E04H 7/065 220/565 |
| 2012/0260602 | A1 * | 10/2012 | Baker | E04F 15/04 52/745.19 |
| 2013/0269601 | A1 * | 10/2013 | Majima | H05B 3/145 117/217 |
| 2014/0252015 | A1 * | 9/2014 | Durukan | H01L 21/6719 220/789 |

FOREIGN PATENT DOCUMENTS

| | | |
|---|---|---|
| JP | S56155528 A | 12/1981 |
| JP | H01123991 A | 5/1989 |
| JP | H0682634 B2 | 10/1994 |

OTHER PUBLICATIONS

International Search Report and Written Opinion for application No. PCT/EP2013/061384, dated Aug. 22, 2013, 11 pages.
Chinese Office Action in Chinese with English translation for CN application No. 201380028573.9, dated Jul. 27, 2016, 6 pages.

* cited by examiner

MODULAR TUBULAR SUSCEPTOR

TECHNICAL FIELD

The invention relates to a susceptor made from graphite or CFC for the process space of protective-gas and vacuum high-temperature process installations, which is of tunnel-like design and can be closed at each of its two ends by means of a cover.

BACKGROUND

Susceptors are understood to be components which are located in the immediate region of the process and either serve for receiving the articles to be treated or surround these in the form of a chamber, so that the process space is largely partitioned off.

The susceptors rest on a carrying structure which is likewise composed of graphite or CFC (CFC: Carbon Fiber Composites). CFC materials are carbon fiber composite materials for high-temperature applications, for example in a furnace. The susceptors are closed at both ends by means of a graphite cover, which graphite covers are mostly suspended on the furnace doors and can therefore be opened and closed in a simple way.

For high-temperature processes, heating elements, mostly bar-type heating elements, are arranged around the susceptor in uniform intervals.

An example of a profiled susceptor for reception of semiconductor wafers in a thermomigration plant may be gathered from EP 1 590 510 B1.

Susceptors are used in vacuum process plants which serve for the production and processing of components made from engineering ceramics, hard metal and other alloys, the components being acted upon by a gas pressure and high temperatures. In particular, the susceptors serve for delimiting the process space with respect to the insulation or other furnace components, so that these are protected from an excessive temperature load or load caused by aggressive gases.

A fundamental problem is the thermal expansion of the susceptor in the course of the process. Depending on the position and size of the useful space, a susceptor can no longer be manufactured from a graphite block. Particularly when the susceptor, as seen in cross section, corresponds to a flattened tube or is of tunnel-like design, this causes the problem that, where appropriate, different crude blocks or even different raw materials have to be used for manufacturing the components.

This has the negative result that the individual components of the susceptor have differences in terms of thermal expansion. The result of this, in turn, is that the durability of the components is restricted, and that the susceptor becomes leaky in relation to the remaining furnace space. The performance of the process plants is thereby impaired, and process parameter flexibility is greatly restricted.

Another problem arises from the use of whole crude blocks for flattened tubes (susceptors) because of the considerable consumption of material, since large cores occur. Since large crude blocks mostly are not compacted so well in the core, the cut-out cores or the residual material cannot be used unrestrictedly for other applications.

SUMMARY

An object of the invention is to provide a flexibly and modularly extendable susceptor which possesses a material-saving construction and, in particular, has uniform thermal expansion.

In accordance with an aspect of the invention, there is provided a susceptor of the type initially mentioned, in that it is composed of a plurality of modules lined up with one another longitudinally into a continuous tunnel, in that each module is composed of a tubular portion and of a baseplate fastened thereto, and in that the end faces between two modules in each case are connected to one another positively.

An advantage of this construction is, on the one hand, that susceptors can be assembled in any desired length, and that the individual modules can be manufactured from the smallest possible blanks which, in turn, have, distributed over the volume, a high homogeneity, so that the modules manufactured from them have the highest possible quality.

In order to obtain especially stable modules, it is advantageous if each tubular portion is screwed to the associated baseplate.

In at least one embodiment of the invention, the positive connection between modules abutting one another is made by means of profiled end faces, one end face having the negative shape of the other end face. On account of the profiling of the end faces, these possess a larger area than planar end faces, thus ensuring good sealing between adjacent modules.

An even better positive connection between two adjacent modules is achieved when, additionally or alternatively to the profiled end faces, in these, bores are introduced, into which pins engage for the positive connection of adjacent modules.

In a further embodiment of the invention, the modules are additionally connected to one another positively and non-positively. For this purpose, the baseplates of adjacent modules are provided with depressions which pass over from module to module and into which connecting elements engage, flush, in a positive manner. Such a connecting element may be a double-T tongue-and-groove connecting element of semicircular cross section.

The tubular portions of each module may also be composed of two or more segments, this likewise affording the advantage of the use of smaller and more homogeneous blanks.

Finally, the modules capable of being lined up with one another may have identical or different lengths, with the result that a fine gradation of the implementable lengths of the susceptor, along with simplification in stockkeeping, becomes possible.

It is especially advantageous if all the components of a module are cut from the same blank, since possible differences in the thermal expansion of individual components are thereby avoided, so that the modules do not become leaky under temperature load.

It is possible, furthermore, to introduce a sealing material between the end faces of adjacent modules, film or graphited cord seals being suitable for this purpose.

Furthermore, the modules may also be connected firmly to one another by adhesive bonding with a graphite cement or a graphite adhesive.

BRIEF DESCRIPTION OF THE DRAWINGS

The invention will be explained in more detail below by means of an exemplary embodiment. In the accompanying drawings.

DETAILED DESCRIPTION

Figure 1:
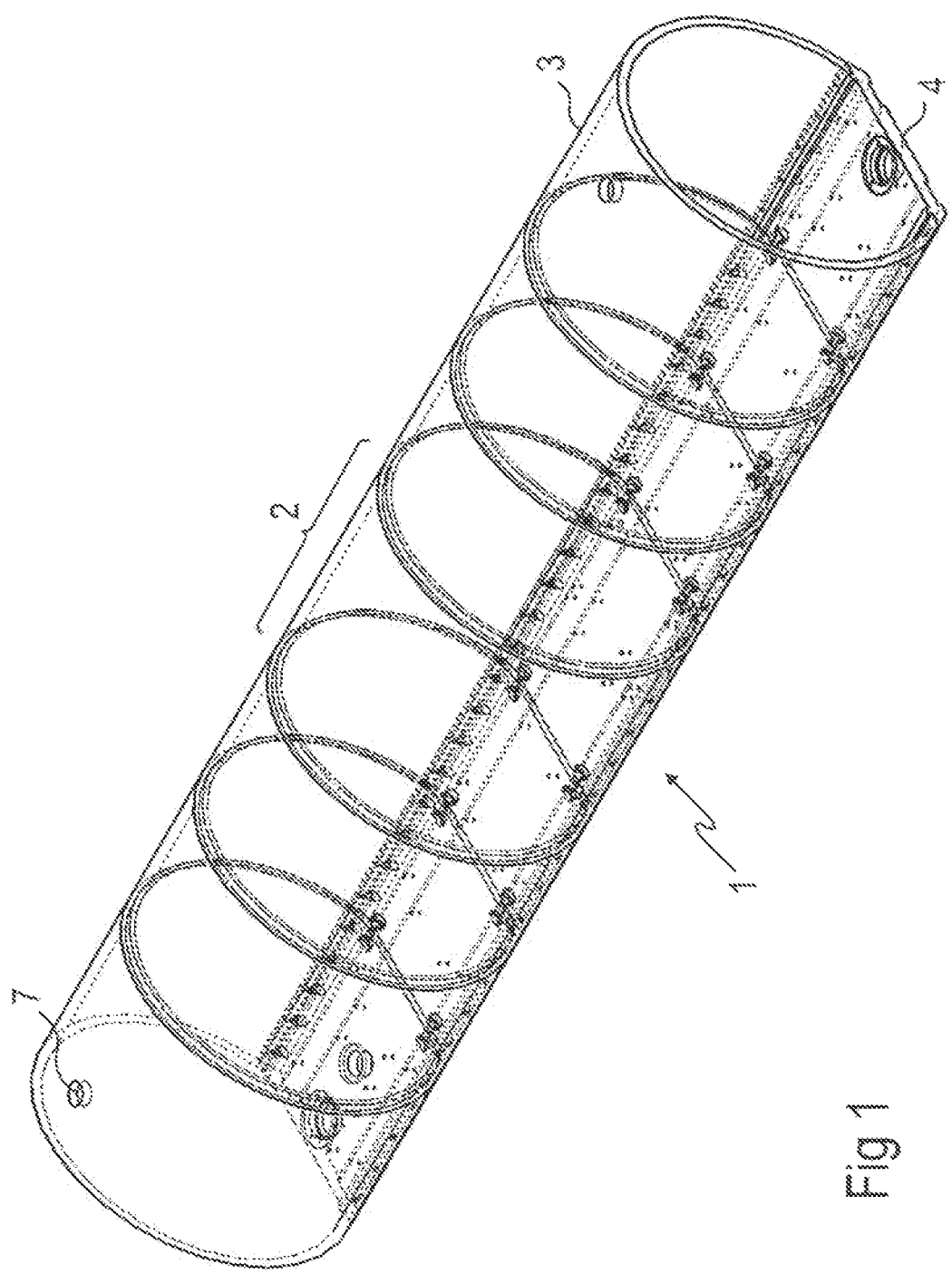
FIG. 1 shows a susceptor assembled from individual modules and having a flattened tubular cross section, composed of a plurality of tubular pieces which are provided in each case with a baseplate.
Figure 2:
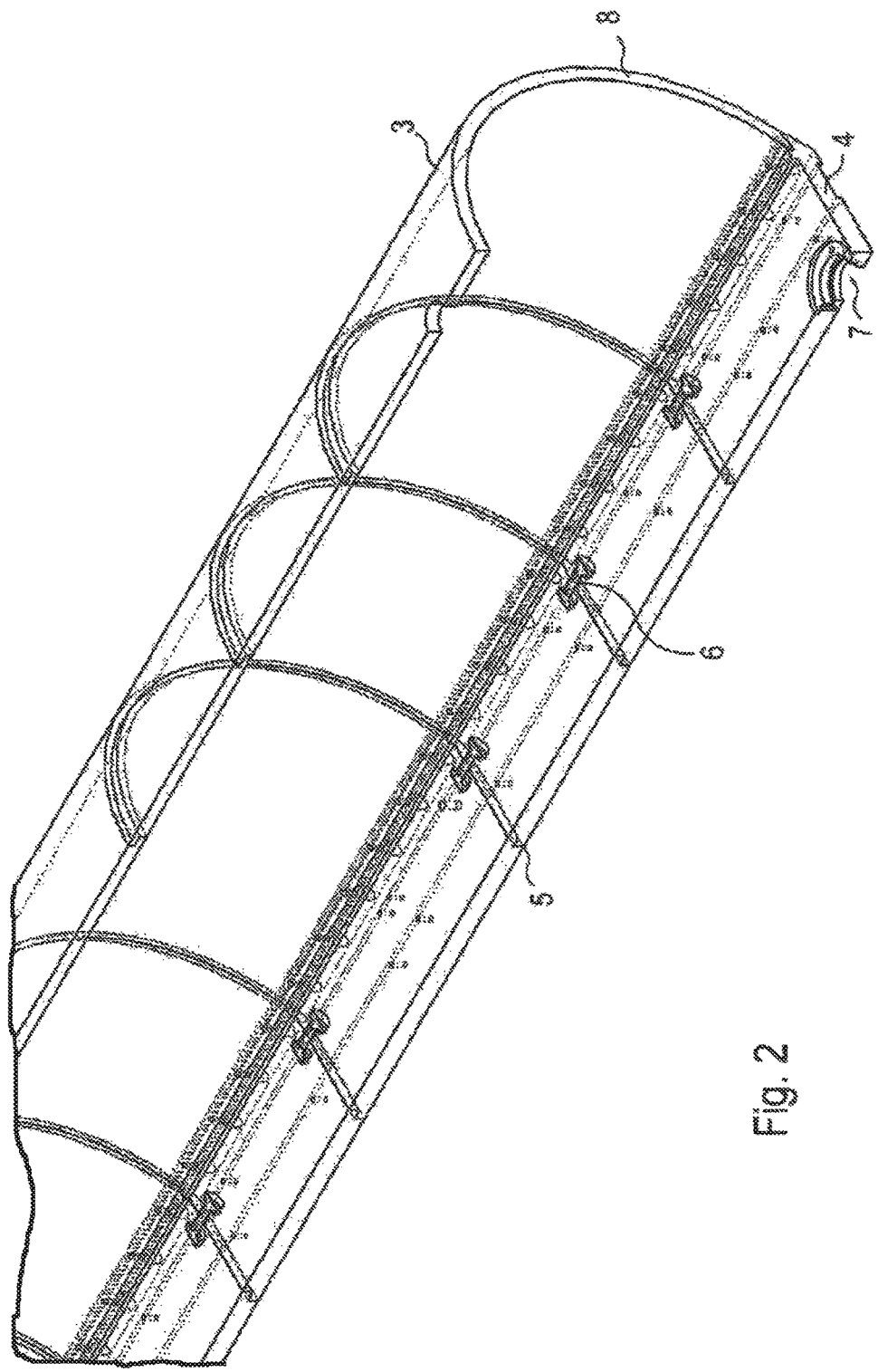
FIG. 2 shows an enlarged perspective illustration of part of a susceptor.

FIG. 1 shows a susceptor 1 assembled from individual modules 2 and having a flattened tubular cross section, each module 2 being composed of a tubular portion 3 which is provided with a baseplate 4. The baseplate 4 is screwed to a tubular portion 3. The end faces 5 between two modules are profiled (FIG. 2), so that the components can be joined together positively by means of a fit. The end faces may, for example, be configured such that one end face 5 has the negative shape of the opposite end face. A good positive connection is thereby achieved, and at the same time the contact area between the end faces 5 is enlarged, thus resulting in better sealing.

Alternatively or additionally, in the end faces, bores may be provided, into which pins engage for the positive connection of adjacent modules. The pins are likewise composed of graphite or CFC.

In order to ensure a good closure of the ends of the susceptor 1 in each case by means of a graphite cover, not illustrated, the outer end faces 8 may be made smooth (FIG. 2) or have an additional sealing element.

On account of the appreciable thermal expansion of the susceptors 1, the graphite covers should be suspended movably or movably in a spring-loaded manner, for example on a furnace door.

Figure 3:
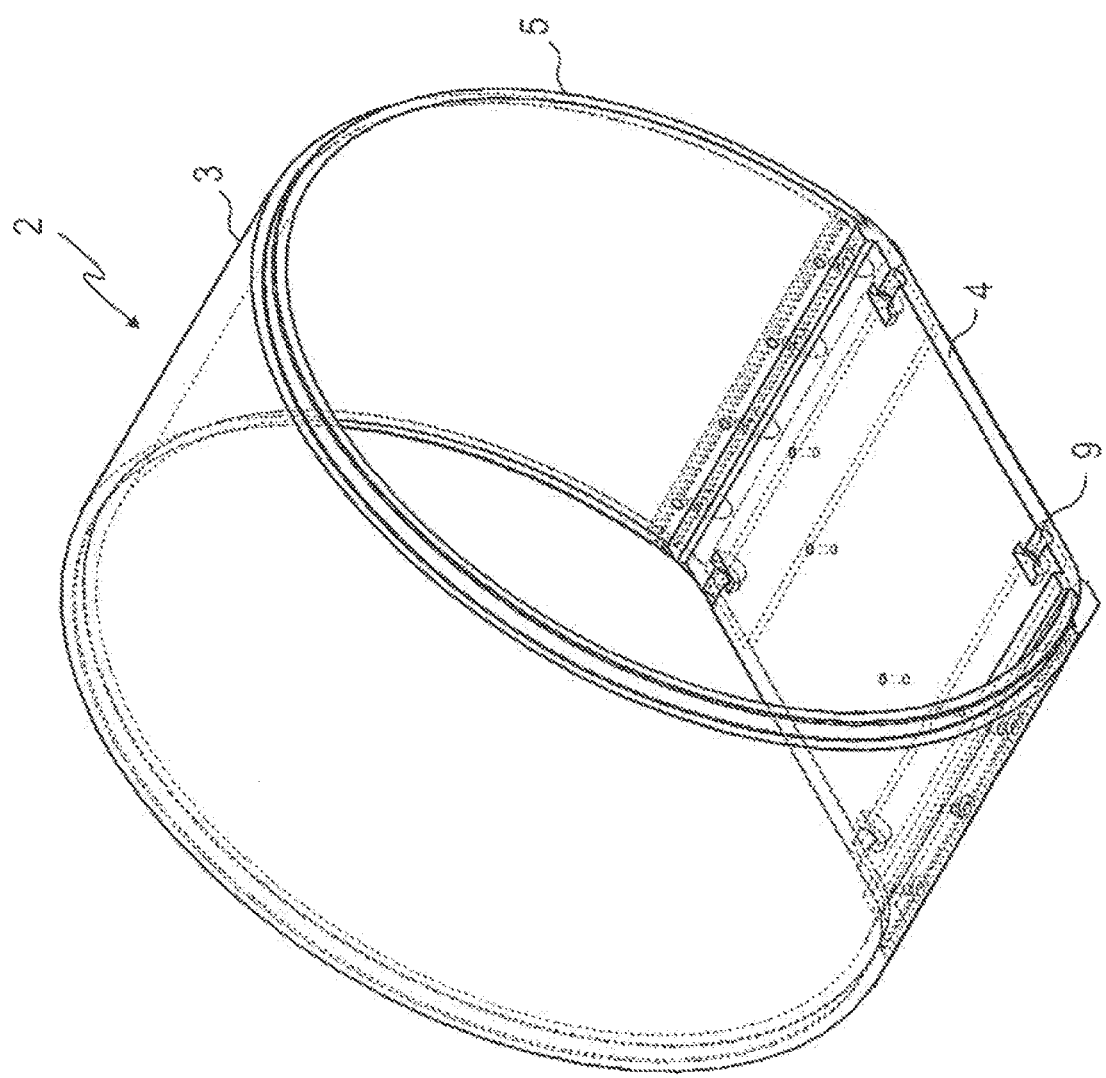
FIG. 3 shows a portion of a susceptor.
Figure 4:
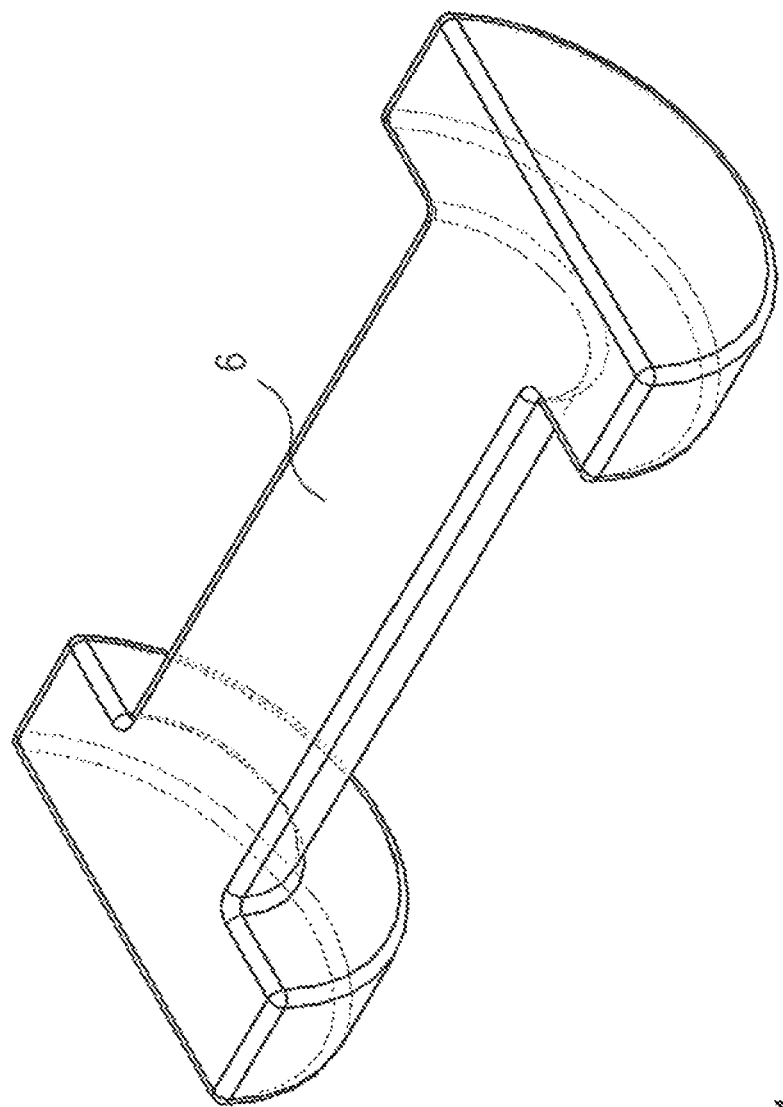
FIG. 4 shows a connecting element for a tongue-and-groove connection.

Furthermore, nonpositive and positive connecting elements 6 (FIG. 4) for connecting the modules 2 firmly to one another may be provided, which engage, flush, into corresponding depressions 9 lying in the baseplates 4 (FIG. 3). FIG. 4 shows such a connecting element 6 in the form of a double-T tongue-and-groove connecting element of semicircular cross section.

In addition, the leaktightness of the joints may be increased by the introduction of film or graphited cord seals or else by adhesive bonding with a graphite cement or graphite adhesive. What is thereby achieved at the same time is that the susceptor, overall, behaves as though it were a susceptor manufactured in one piece. All the components of the susceptor 1 are composed of graphite or CFC.

If the susceptors 1 are assembled from modules 2 of different width, a multiplicity of different tube lengths of the susceptor can be implemented in a simple way. It is therefore sufficient for the manufacture of the susceptors 1 to keep a certain number of modules 2 of different width in stock, and there can still be a rapid response to different customer wishes. Stockkeeping is thereby simplified most appreciably.

Particularly where larger susceptors are concerned, it may be advantageous if the tubular portions 3 are divided into a plurality of segments. The advantage of this is that susceptors with a large inner space can be manufactured from comparatively small blanks. Here, too, profiled end faces are provided, so that the individual parts can be connected positively to one another. In addition, it is also possible to connect the end faces to one another nonpositively, and this can be implemented by means of the connecting elements 6 described.

In any event, the size of the individual parts of a module 2 should be selected such that they can be manufactured from the same blank. This ensures that the thermal expansion is the same for individual parts of each module 2, thus ensuring that the entire susceptor 1 has a uniform longitudinal expansion. The leaktightness of the joints and of the end faces with respect to the doors or covers is consequently ensured at all times.

In addition, in some modules 2, supply and disposal ports 7 may be provided for media. It can be seen from FIG. 1 that the in each case outer modules 2 are provided with such ports 7.

Of course, susceptors 1 with other cross-sectional shapes, for example even rectangular, can also be assembled in the same way, as described above.

The invention in at least some embodiments provides a flexible, modular and material-saving construction of susceptors 1.

LIST OF REFERENCE SYMBOLS

1 Susceptor
2 Module
3 Tubular portion
4 Baseplate
5 End face
6 Connecting element
7 Supply and disposal port
8 End face
9 Depression

The invention claimed is:

1. A susceptor for delimiting process space in protective gas and vacuum process installations, said susceptor is made from graphite, and closable at each of two opposite ends by a cover, the susceptor comprising a plurality of modules which are lined up with one another longitudinally into a continuous tunnel and which are connected to one another positively and nonpositively, wherein each module is composed of two components, said two components being a tubular portion and a baseplate screwed thereto,
   wherein a first module and a second module are adjacent having profiled end faces where the first module has a first end face abutting a second end face of the second module said first module and second module have a positive connection where the end face of the first module has the negative shape of the end face of the second module;
   wherein the baseplate of each adjacent module is provided with depressions which pass over from the first module to the second module and a connector engages flush into each depression between adjacent modules to connect the first module and the second module, wherein the connector is a double-T tongue-and-groove connector having a semicircular cross-section, said connector is a pin made of graphite and said pin has a flat upper surface and an outer lower surface engaging the depression between adjacent modules and said outer lower surface having a per portion with a semicircular shape, and wherein all of the components of each module are cut from a same blank of graphite.

2. The susceptor as defined in claim 1, wherein at least one of the modules has a length different from a length of another one of the modules.

3. The susceptor as defined in claim 1, further comprising a sealing material interposed between said end faces of adjacent modules.

4. The susceptor as defined in claim 1, wherein adjacent modules are connected to each other by a graphite cement or graphite adhesive.

\* \* \* \* \*